United States Patent
Herr et al.

(10) Patent No.: US 6,518,673 B2
(45) Date of Patent: Feb. 11, 2003

(54) CAPACITOR FOR SIGNAL PROPAGATION ACROSS GROUND PLANE BOUNDARIES IN SUPERCONDUCTOR INTEGRATED CIRCUITS

(75) Inventors: Quentin P. Herr, Torrance, CA (US); Lynn A. Abelson, Rancho Palos Verdes, CA (US); George L. Kerber, San Diego, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/882,979

(22) Filed: Jun. 15, 2001

(65) Prior Publication Data

US 2002/0190381 A1 Dec. 19, 2002

(51) Int. Cl.[7] .................. H01L 23/48; H01L 39/00; H01L 29/40; H01L 29/06
(52) U.S. Cl. .................. 257/758; 257/662; 257/663; 257/664; 257/37; 257/39
(58) Field of Search ............... 257/758, 662, 663, 37, 39, 664

(56) References Cited

U.S. PATENT DOCUMENTS

| | | | | |
|---|---|---|---|---|
| 4,082,991 A | * | 4/1978 | Constant | 257/216 |
| 4,421,785 A | * | 12/1983 | Kroger | 148/DIG. 89 |
| 4,430,662 A | * | 2/1984 | Jillie et al. | 257/36 |
| 4,498,228 A | * | 2/1985 | Jillie et al. | 216/3 |
| 4,554,567 A | * | 11/1985 | Jillie et al. | 257/36 |
| 4,589,961 A | * | 5/1986 | Gershenson | 205/122 |
| 5,760,463 A | * | 6/1998 | Hato | 257/37 |
| 5,965,494 A | * | 10/1999 | Terashima et al. | 333/219 |

* cited by examiner

*Primary Examiner*—Hoai Ho
*Assistant Examiner*—Ly Duy Pham
(74) *Attorney, Agent, or Firm*—Ronald M. Goldman

(57) ABSTRACT

The self inductance associated with a capacitance A52 in a superconductor integrated circuit (FIG. 1) is reduced by adding a layer of superconductor metal (A54) overlying the capacitor, effectively producing a negative inductance to counteract the self-inductance of the capacitor leads, thereby reducing inductance of the circuit. As a result it possible to transfer a single flux quantum ("SFQ") pulse through the capacitor. Capacitors (19 and 25 FIG. 5) of the foregoing type are incorporated in superconductor integrated circuit SFQ transmission lines (FIG. 5) to permit SQUID-to-SQUID transfer of SFQ pulses, while maintaining the circuit grounds of the respective SQUIDs in DC isolation. Bias current (10) may be supplied to multiple SQUIDs (1 & 3, 7 & 9 FIG. 5) serially, reducing the supply current required previously for operation of multiple SQUIDs.

5 Claims, 5 Drawing Sheets

CAPACITOR FOR SIGNAL PROPAGATION ACROSS GROUND PLANE BOUNDARIES IN SUPERCONDUCTOR INTEGRATED CIRCUITS

FIELD OF THE INVENTION

This invention relates to superconductor integrated circuits ("ICs") and, more particularly, to reduction of electrical current demand and electronic noise in superconductor ICs, to a single-flux-quantum Josephson transmission line (JTL) formed of a superconductor IC, to reduction of self-inductance of superconductor leads, to a capacitor design that permits coupling single flux quantum pulses without interference caused by self inductance of the capacitor leads that is useful in the foregoing transmission line, and to the method of fabricating that capacitor and the single flux quantum pulse transmission line.

BACKGROUND

Metals and metal alloys found to exhibit zero electrical resistance at some temperature are commonly referred to as superconductors. Each such superconductor metal or metal alloy possesses a particular cryogenic temperature, referred to as the transition temperature (Tc), at which the respective metal and metal alloy becomes superconducting and changes in electrical resistance from a measurable or relatively high value of resistance to a value of zero.

At room temperatures those metals and metal alloys possess a measurable value of electrical resistance and are not superconducting. The metals and alloys do not attain the superconductive state unless cooled, typically, to extremely low temperatures, cryogenic temperatures. As a consequence of the zero-resistance characteristic of the superconductor in the superconducting state, electrical current induced, as example, into a loop formed of the superconductor cooled below the respective transition temperature persists indefinitely. One well known superconductor or, as alternately referred to, superconductor metal is niobium, a refractory metal, which transitions to a superconducting state at a temperature of 9.2 Kelvin.

Digital electronic devices have previously been constructed of superconductor metals and the functionality of such devices demonstrated. A principal element to the construction of a superconductor digital electronic device is the Josephson junction, discovered in the early '60's. A Josephson junction is formed, as example, of two layers of superconductors, such as niobium, separated by a very thin layer of electrical insulation, such as aluminum oxide. When cooled to the transition temperature and biased with DC current below a "critical current", the Josephson junction conducts current without developing a voltage drop across the junction and without dissipation of the current. Consequently the junction does not produce heat, which is a significant advantage for electronic circuits or integrated circuits. If biased above the critical current, the Josephson junction produces an RF signal, consisting of a series of pulses at RF frequencies. Thus, the critical current is a boundary at which the electrical properties of the junction changes as described.

Another interesting property is that current or energy introduced to the junction by a single flux quantum pulse is sufficient, when added to the appropriate DC bias current, to cause the Josephson junction to momentarily exceed the critical current for the junction and undergo a 360 degree shift in quantum phase or, as otherwise termed, electronically "flip-over". The single flux quantum pulse is a physical constant and comprises 2.07 millivolts per picosecond or, in alternate terms, 2.07 milliamps per picohenry. In undergoing that shift the junction reproduces the single flux quantum pulse.

Superconductor digital electronic devices typically require cryogenic temperatures, below the transition temperature of the superconductor. Hence a necessary component of the electronic device is an appropriate refrigeration or other cooling apparatus. The device further requires a relatively large DC bias current. Thus, another necessary component is the inclusion of DC bias current supplies, each typically required to supply about 0.1 mA to each Josephson junction within the superconducting ICs. Despite such unwelcome appendages, such superconductor devices operate at very high speeds, as example, 100 GHz to 770 GHz, and very low power, which is unattainable with present semiconductor devices. Because of the high speeds of operation and low power requirement, superconductor electronic devices remain attractive for many applications.

In superconducting integrated circuit devices containing multiple Josephson junctions, the junctions are formed on a common superconductor metal layer, referred to as a ground plane deposited over an insulator substrate. The multiple Josephson junction devices may be logically divided into groups of two or more junctions, the groups referred to as "SQUIDs" (the acronym for superconducting quantum interference device). For example, a single flux quantum pulse transmission line may contain a number of SQUIDs arranged in serial order, each SQUID containing two Josephson junctions connected electrically in parallel in a superconducting loop, also referred to herein as a Josephson loop (See, as example, Josephson junctions 1 and 3 in FIG. 5).

A single flux quantum pulse, introduced at the input to the Josephson transmission line (JTL), propagates along the transmission line to the output, effectively transferring the single flux quantum pulse from SQUID to SQUID in that line. In addition, the pulse is regenerated at each stage which can produce current and power gain. The transmission line may in total contain two or more Josephson junctions, the number of Josephson junctions (and SQUIDs) that form the transmission line is proportional to the distance the SFQ pulse is to traverse.

For operation, each Josephson junction in the SQUID is required to be biased with a certain level of DC current. Because the Josephson junctions are connected, directly or indirectly, to a common superconductor metal that serves as the ground plane and, hence, as a connection point for the ground polarity lead of the bias power supply, the DC bias currents required by the individual junction devices is additive. That is, the DC bias current is supplied from the current source, the power supply, in parallel to each Josephson junction. More complex superconductor devices, such as superconductor very large scale integrated circuits ("VLSI") may contain even greater numbers of Josephson junctions, and, hence, in accordance with existing design, requires a power supply capable of supplying even larger levels of DC current. The bias current demand of a superconductor VLSI with one million junctions could easily require one-hundred or more amperes from the power supply at a very low voltage.

A large DC current requirement is undesirable, since the feed lines for that current will generate large magnetic fields, that may interfere with circuit operation. Moreover, delivery of the current to the cryogenic system requires heavy-gauge wires that have a high thermal conductivity and forms a path over which external heat could be introduced, increasing the load on the cryogenic system. Thus, both the thermal load and total system power are increased, which is undesirable.

An approach one might take to lower the DC current demand on the bias source is to place the various Josephson junctions in an electrical series circuit and employ a bias power supply of higher voltage than before to provide the DC bias current through each of the Josephson junctions in series. Each junction then receives the same requisite bias current required for operation. To form such a series circuit, the various SQUIDs (or Josephson junctions) cannot be connected to a common ground plane (superconductor metal layer), as in the existing design, described earlier. Instead, each SQUID (or junction) must contain a separate ground plane and the individual ground planes must be DC isolated from one another.

Although the foregoing approach would appear to solve the bias supply problem by eliminating high current draw while providing the requisite electrical isolation, such a solution fails to take into account the functioning and purpose of the circuit. In the example of a single flux quantum pulse transmission line, that purpose is to transfer a single flux quantum pulse from one SQUID to another along the transmission line. If the individual SQUIDs are DC isolated from one another as described, the only means to couple, that is, transfer, a single flux quantum pulse from one SQUID to another in the formed transmission line and maintain DC isolation between the SQUIDS is to use differential coupling. To provide that differential coupling, electrical capacitors are added into the circuit between the pulse transmission circuits of the SQUID and also between the ground planes thereof. A capacitor would be connected from the output of one SQUID to the input of the next SQUID in the transmission line, and another capacitor is connected between the ground plane of the one SQUID to the ground plane of the next SQUID, much as one might design for propagating an AC signal along a chain of isolated active AC amplifiers.

The frequency of operation of the superconductor ICs is very high, and requires very low impedance interconnects, as example, impedance between and including one to ten ohms. Therefore, the electrical characteristics inherent in the structure of a capacitor, namely the dielectric, the conductive plates and the accompanying electrical leads, include not only the desired capacitance, but undesired parasitic inductance as well. In effect, the foregoing capacitor provides a circuit electrically equivalent to an inductance and a capacitance in series circuit.

The parasitic inductance, which is insignificant at the lower frequencies is quite large and is found to have a predominate effect that precludes propagation of single flux quantum pulses. In other words, at the frequency and switching speeds inherent in the operation of the Josephson junction, in practice, one is unable to add only capacitance to the circuit; inductance is added as well. That inductance is anathema to transmission of a single flux quantum pulse through the capacitor.

The inductance reduces the current produced in the circuit by the single flux quantum pulse. With reduced current applied to the Josephson Junction in the input stage of the next SQUID in the chain, the sum of the DC bias current and the reduced current of the pulse is insufficient to attain the critical current necessary for the Josephson Junction to "flip-over", and transfer a single flux quantum pulse through the SQUID. The junction remains current conducting, and, effectively, the single flux quantum pulse disappears.

Because of the foregoing adverse effect it has not been possible to reduce DC current demand on the bias power supply or incorporate a capacitor in the SQUID circuit to achieve DC isolation between stages, and the goal is incapable of practical realization. As an advantage, the present invention realizes the means for accomplishing desired electrical isolation without adverse effect on transmission of single flux quantum pulses that is capable of practical realization.

Accordingly, an object of the present invention is to permit single flux quantum pulses to propagate across ground plane boundaries in superconductor integrated circuits.

A further object of the invention is to significantly reduce the DC current draw required to power superconductor ICs containing large numbers of Josephson junctions.

A still further object of the invention is to provide a means to introduce coupling capacitance in a superconductor electronic circuit and concurrently reduce the effect of the parasitic inductance inherent in the wiring leads for the coupling capacitance.

An additional object of the invention is to create a negative inductance within a superconductor integrated circuit.

A still additional object of the invention is to produce a new electrical capacitor for a superconductor integrated circuit.

And an ancillary object of the invention is to provide a method for fabricating a dielectric element in a superconductor integrated circuit.

SUMMARY OF THE INVENTION

The invention recognizes that a capacitor included within a superconductor integrated circuit exhibits both capacitance and inductance in a series circuit. Considered separately, the inductance is large, and any single flux quantum voltage pulse applied to an end of that series circuit appears across the inductor and cannot pass through to the other end of the circuit. Normally, the ground plane underlying the superconductor wiring is continuous. This greatly reduces inductance, as is well known in the art. The inductance associated with the capacitor structure is large because no such ground plane exists in this case. A principal discovery is that an additional body of superconductor, a layer of superconductor metal (sometimes hereafter referred to as a "sky plane"), positioned proximate to the capacitor effectively changes the electrical characteristic of the foregoing series circuit, significantly reducing the level of the undesired inductance. This so-called "sky plane" acts as a ground plane between ground planes, thereby dramatically reducing the inductance of the capacitor leads. The net or resultant inductance is sufficiently low in value (or insignificant) providing a net characteristic for the series circuit that is highly capacitive in character. As a consequence, it is possible for the first time to send an SFQ pulse through the capacitor.

Further in accordance with the invention, a superconductor integrated circuit includes a layer of dielectric material sandwiched between first and second metal plates to define a capacitor, a superconductor layer overlying that capacitor in magnetic flux coupling relationship with the capacitor and the leads of the capacitor a first Josephson junction, and a second Josephson junction with a first terminal of each of those junctions electrically connected to the first and second metal plates, respectively, whereby single flux quantum pulses produced by said first Josephson junction may be coupled through said capacitor to said second Josephson junction.

In accordance with a specific aspect to the invention, the dielectric material of the capacitor comprises an oxide of the metal of said first metal plate.

In accordance with the new method of forming the capacitor for the superconductor integrated circuit, the first metal plate is anodized to produce the metal oxide that serves as the dielectric and form an integral unitary assembly with the metal plate. More specifically, the standard photo-lithographic mask and etch procedures used to produce prescribed patterns of metal and insulating material in strata on a silicon wafer is modified to include anodization of a portion of a metal layer to produce an integral layer of insulating oxide that has a dielectric constant significantly greater than the insulating material used to produce the insulating strata on the wafer.

In accordance with further aspect to the invention, the foregoing method is adapted to the fabrication of a capacitor that provides DC isolation between stages of a superconducting digital integrated circuit, either in the signal path in that circuit or in isolation of ground planes of different stages of the active circuits contained in the superconducting ICs or in both situations. In the method, the lower most segmented metal layer of the ICs is formed with metal connecting bridges between the segments, placing the segments electrically in common; the segments and bridges are anodized to form at least the dielectric of the capacitor; and, following anodization, metal connecting bridges are removed so that the segments are no longer electrically connected together, but are DC isolated.

The foregoing and additional objects and advantages of the invention together with the structure characteristic thereof, which was only briefly summarized in the foregoing passages, will become more apparent to those skilled in the art upon reading the detailed description of a preferred embodiment of the invention, which follows in this specification, taken together with the illustrations thereof presented in the accompanying drawings.

DESCRIPTION OF THE PREFERRED EMBODIMENTS

The successful transmission of a single flux quantum pulse through a capacitor integrated in a superconductor integrated circuit device is essential to the various inventions presented in this disclosure. In its simplest structure a capacitor is formed by sandwiching a dielectric material between two flat electrodes. The capacitor provides for the passage of AC voltage and current through the dielectric while blocking DC. The electrodes of the capacitor and also the wiring or, as variously termed, leads to those electrodes, which carries current during operation that produces magnetic flux and, hence, inherently produces an electrical inductance that is in series circuit with the capacitance. As described in the foregoing background that inductance produces a predominant effect on a single flux quantum pulse, and effectively consumes the pulse. The novel capacitor that is integrated within a superconductor integrated circuit in accordance with the invention possesses a significantly reduced inductance by inclusion of an additional element that effectively reduces the inductance of the wiring to the capacitor. In effect the additional element, the sky-plane, adds a negative inductance to the series circuit. The effect of that negative inductance is to reduce the series inductance of the capacitor wiring to such a low level that the net inductance does not adversely affect the single flux quantum pulse.

Figure 1:
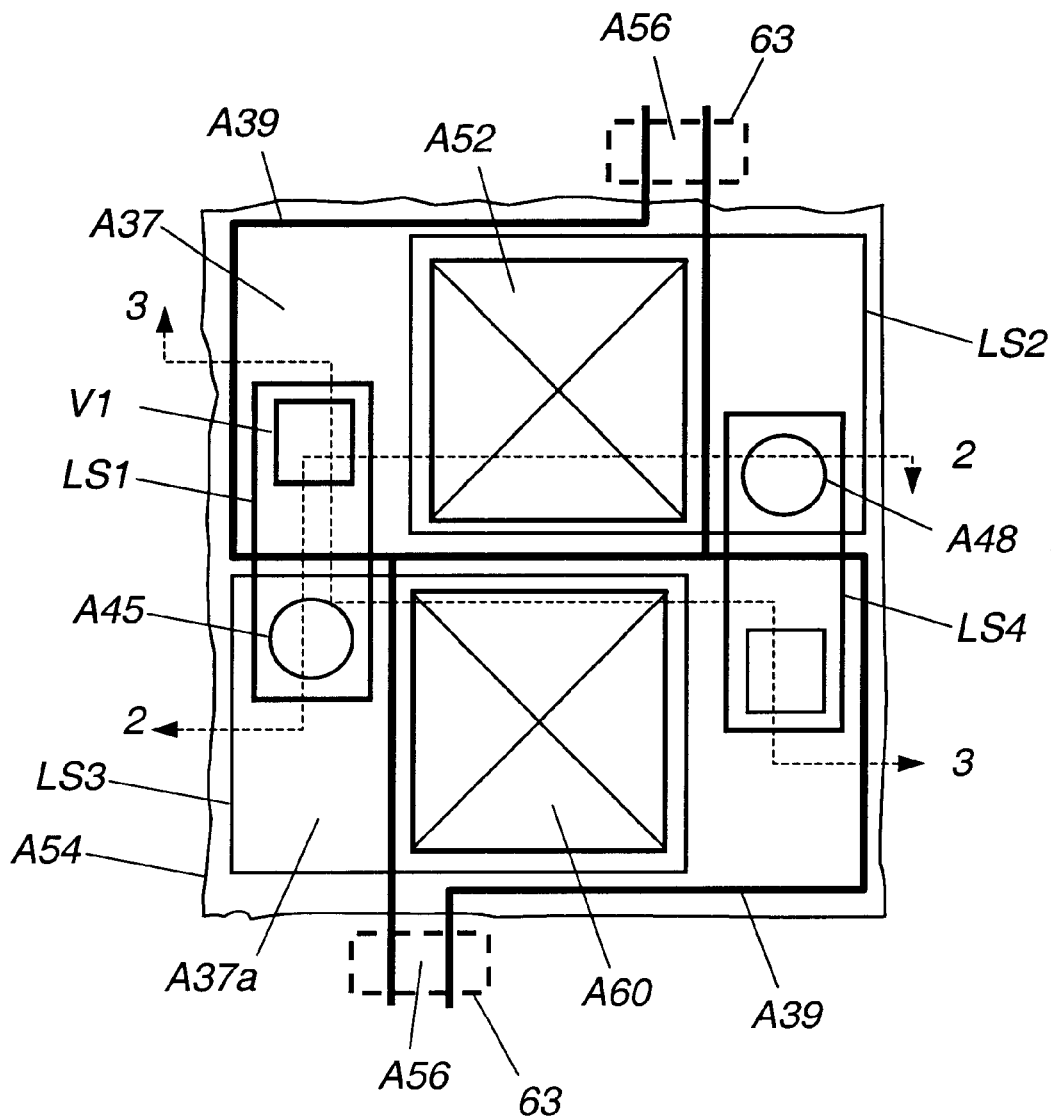
FIG. 1 is a pictorial showing the layout of an embodiment of a superconductor integrated circuit incorporating the invention.

As is known superconductor integrated circuits are constructed in accordance with conventional photolithographic mask and etch techniques similar to those used in the fabrication semiconductor devices, to produce a unitary, one-piece structure containing all of the digital superconductor circuits on a single chip. FIG. 1, to which reference is made, is a pictorial layout of an embodiment of a superconductor integrated circuit incorporating the invention. Because the IC is constructed with elements in various strata the graphics convention is to illustrate the elements that are higher in the strata of the IC chip with the thinnest of lines; and use increasing gradations of line thickness in dependence on how low in level the elements appear. The IC contains two Josephson junctions A45 and A48, two capacitors A52 and A60, metal wiring LS1–LS4, superconductor metal layer 54 and various other elements and wiring, which are discussed in greater detail in connection with the section views of FIGS. 2 and 3, next considered.

Figure 2:
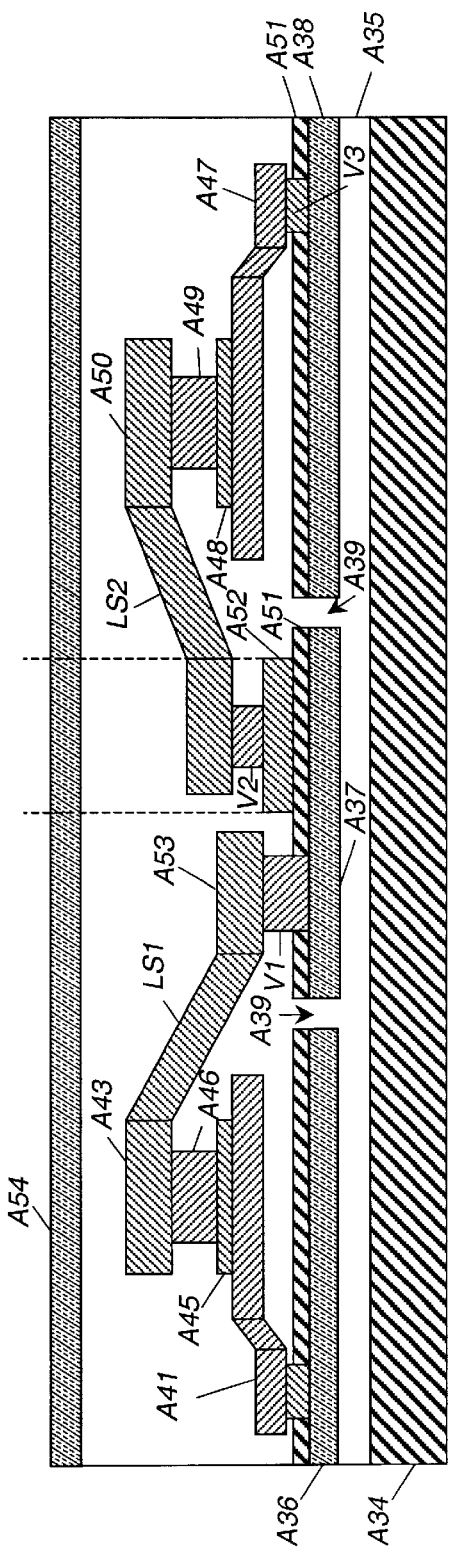
FIG. 2 is a section of the superconductor integrated circuit embodiment of FIG. 1 taken along the line 2—2 an enlarged, illustrating, not-to-scale, the dielectric of an interstage coupling capacitor and the relationship of that dielectric to the Josephson junctions of the integrated circuit.

FIG. 2 illustrates a portion of a superconductor integrated circuit in profile, not-to-scale, taken along the circuituitous section line 2—2 in FIG. 1. The section view showing the structure of a capacitor A51 and two Josephson junctions A45 and A48, to which reference was made earlier. The superconductor integrated circuit is fabricated on a silicon wafer A-34, the same wafer as commonly used in the semiconductor industry. Through conventional thin film photolithographic mask, and etch techniques, the various layers of metal and insulator are formed in the integrated circuit as later herein more fully described.

An insulating layer A35, a dielectric, is thermally grown on the surface of the wafer, A34, and serves as a base for the bottom metal layer to the integrated circuit. The bottom metal layer is illustrated in separate pieces. This bottom metal layer contains separate superconductor metal layers A-36, A-37 and A38, suitably of niobium (Nb), separated by insulating portions A-39, suitably of silicon dioxide ($SiO_2$). A pair of wiring layers A41 and A43, also of niobium, is included higher in the strata, shown to the left side of the figure. A Josephson junction A45 is formed in three layers.

The layers comprising the Nb metal, aluminum oxide, and Nb metal, which are, as example, 200 nm, 5 nm and 100 nm thick, respectively. The lower layer of the junction is of a greater width than the upper layer and is connected by metal layer A41 to first wiring layer A36. Another superconductor metal layer A46 is formed atop the junction A45 and provides an electrically conductive path to upper wiring layer A43.

A second Josephson junction A48 is formed, like the first, in three layers, the junction comprising the same tri-layer of materials as in Josephson junction A45. A superconductor metal layer 49 overlies and electrically connects to junction A48. A superconductor metal wire layer A50, suitably Nb, overlies and connects to metal layer A49 in the stratum, and, hence, to a terminal of the underlying Josephson junction A48. A layer of high dielectric material A51 is situated on the upper surface of metal layer A37. Due to practicality in manufacture, later herein described, the same dielectric layer also is present on the upper surface of bottom metal layers A36 and A38.

A metal layer A52 is deposited atop dielectric A51 and serves as one electrode of the capacitor, the latter of which for convenience is also denominated A52. Metal layer A52 is smaller in surface area than the upper surface of the dielectric A51. A portion of the surface of metal layer A37 and metal layer A52 serve as the parallel plates of a capacitor, and sandwich a portion of the high dielectric layer A51 in between. Since only the region sandwiched between layer A52 and A37 serves as the capacitor, the remaining dielectric surface A51 is surplus. Since that surplus does not adversely affect operation, it is simpler to leave the excess dielectric in place than to remove the excess.

The dielectric material A51 of the capacitor is different from the dielectric material that insulates the other metal parts of the integrated circuit, that material being the silicon dioxide earlier described, and is of a higher dielectric constant. High dielectric A51 preferably constitutes an oxide of the underlying metal of layer A37, niobium oxide ($Nb_2O_5$) and forms a unitary one-piece assembly therewith. The niobium oxide is a dielectric having a high dielectric constant, of about 40, one that is about 10 times larger than the dielectric constant of the silicon oxide, also a dielectric, that is used to insulate the metal layers. Because of the higher dielectric constant, it is possible to obtain higher capacitance in a smaller area than with the silicon oxide.

Wire A43, connected to a terminal of Josephson junction A45, also connects indirectly to one side of the formed capacitor by the metal via layer A53, the underlying connecting via V1, and metal layer A37. Wire layer A50 connects to the other terminal of that capacitor by a via V2, to the second Josephson junction A48. On the right side of the figure, superconductor metal layer A47, suitably niobium, is formed on top of an insulating layer, suitably formed of silicon dioxide, and electrically connects, via a via V3, to bottom metal A38, the latter of which serves as a circuit common.

The region located between metal layer A54 and layer A34 in the side section view of FIG. 2 as illustrated contains voids, areas appearing as white space. As those skilled in the art appreciate the white space is comprised of electrically nonconductive material, insulating material, that is deposited in stages to form a completed assembly. Some of that insulating material has been separately described as A35 and A39, but the remainder is not separately illustrated or designated to avoid unnecessarily complicating the illustration and this description with information and details that are not necessary to an understanding of the invention.

An insulating layer, not separately illustrated, is formed above metal layers A43 and A50. A superconductor metal layer A54, suitably niobium, is deposited on top of that insulating layer. The foregoing metal layer or plate, as variously termed, covers a wide area, such as pictorially illustrated in the layout of FIG. 1, sufficient to cover all of the formed elements previously described, the Josephson junctions A45 and A48 adjacent to the capacitor or capacitors A52 and A60, and, where the capacitor connected between the spaced lower metal segments are included, the plate covers this as well. Continuing with FIG. 1, Superconductor metal layer A54, the sky plane earlier referred to, serves to constrain the magnetic flux field produced by current through the described capacitors and is the added element, earlier referred to, that functions in conjunction with those capacitors that lowers impedance and allows transmission of single flux quantum pulse through the capacitor.

Figure 3:
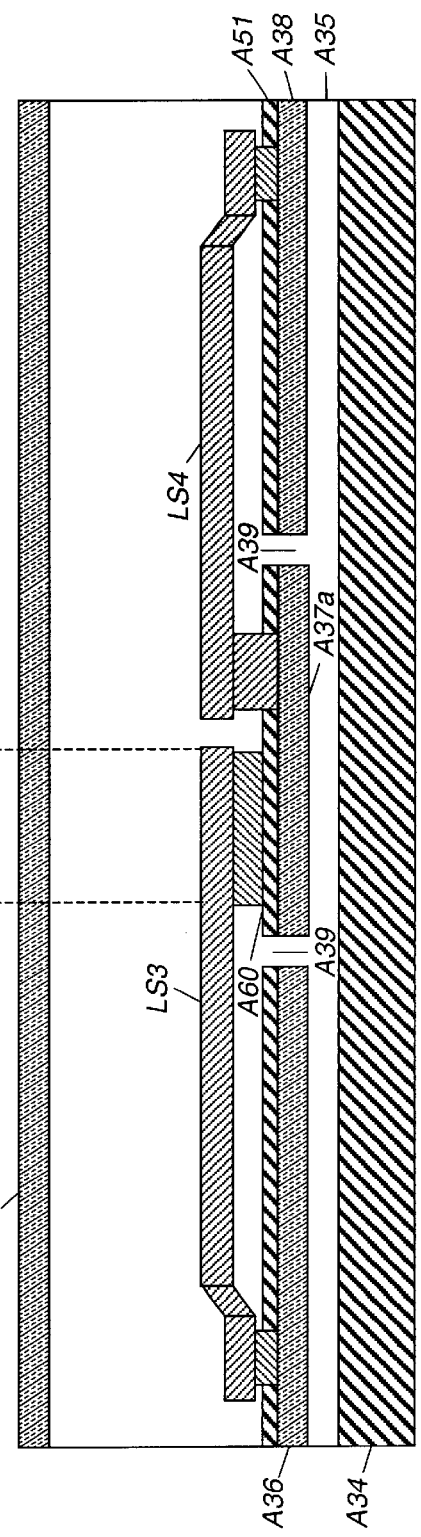
FIG. 3 is a section view of the embodiment of FIG. 1 taken along the line 3—3 and enlarged, illustrating, not to scale, the embodiment from a different angle to show the second capacitor that is connected between the ground segments of different SQUIDs.
Figure 4:
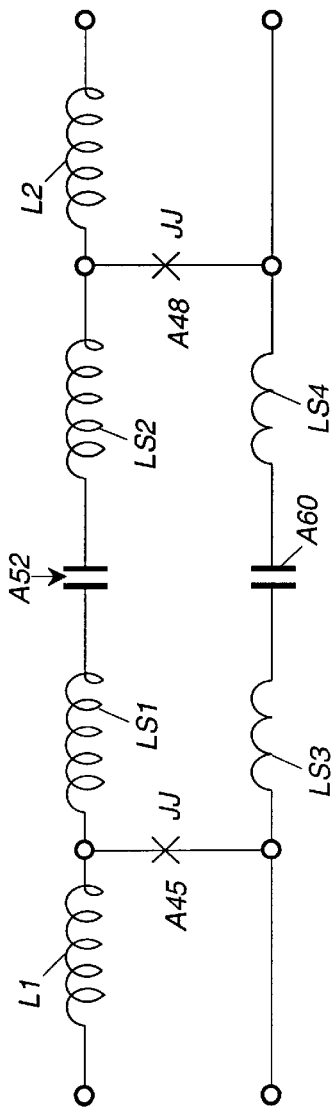
FIG. 4 is a schematic of the embodiment illustrated in FIGS. 1–3.

For reasons earlier presented, the preferred form of the invention includes DC isolation not only in the signal circuit as depicted in the schematic of FIG. 4, later discussed, but also includes DC isolation between the circuit commons of the two Josephson junctions A45 and A48 that are coupled together through capacitor A52. In such an embodiment, the circuit commons A36 and A38 are segmented, as was illustrated in FIG. 2, and those segments are coupled through a second capacitor. Reference is made to the section profile of FIG. 3, which illustrates another view of the integrated circuit of FIG. 1 taken along the circuituitous section line 3—3. As illustrated, a second formed capacitor A60 is connected between and DC isolates metal segments A36 and A38. This capacitor is of the same structure as the capacitor A52 in FIG. 1, earlier described. Thus a metal electrode coupled to LS3 is in contact with the top surface of a dielectric layer and serves as one plate of the capacitor and the underlying metal segment 37a serves as the second metal plate to the capacitor. The upper electrode to the capacitor connects via lead LS3 and another via to segment A36, which is a circuit common. The second electrode connects to segment A38 by means of a via, metal wiring LS4, and a second via illustrated on the right in the figure.

The superconductor integrated circuit portion illustrated in the section views of FIGS. 2 and 3 is represented schematically in FIG. 4 to which reference is made. As is evident from the schematic, capacitance A52 defines an interstage coupling capacitor between Josephson junction A45 and Josephson junction A48. Inductance LS1 and inductance LS2 represent the self-inductance associated with the leads or wiring connecting the capacitor between the Josephson junctions A45 and A48, that is, the net or reduced level of self-inductance resulting from the inclusion of the sky plane layer. Inductance L1 and L2 are recognized as the self-inductance of the wiring associated respectively with Josephson junctions A45 and A48. The value of the latter inductance's is unaffected by sky plane A54. The foregoing is recognized as the signal path through the circuit. Capacitance A60 DC isolates the circuit commons of the circuit from the left from that circuit on the right. Inductances LS3 and LS4 represent the self-inductance associated with the leads or wiring connecting capacitor A60 to the respective circuit commons, that is the net or reduced level of self-inductance resulting from the inclusion of the sky plane layer. The latter is recognized as the circuit common coupling path. As one appreciates, the schematic of a circuit that omits the sky plane A54 and the function of that sky plane would be identical to that presented in FIG. 4, except that the circuit would not function to propagate a SFQ pulse. As should be recognized, the foregoing circuit is a part of the circuit of the single flux quantum pulse transmission line schematically illustrated in FIG. 5, elsewhere herein described.

Returning to FIG. 2, the superconductor metal sky plane layer A54 is found to reduce the self-inductance's LS1–LS4 (FIG. 2), in the interstage coupling circuit and in the circuit common coupling circuit, sufficiently to permit an SFQ pulse to pass through. By including the superconductor metal layer A54 in the integrated circuit positioned in an overlying relationship with the capacitance, the superconductor metal layer is placed in the magnetic flux field generated by the current flowing through the electrical leads and dielectric of that capacitor (and the second capacitor as well). It is recognized that the magnetic flux in the superconductor layer in turn generates an electric current in the superconductor layer, which being in a superconductive state, in turn, produces a magnetic field that opposes the initiating field, producing field cancellation external to the integrated circuit. The net effect is that the superconductor layer constrains the magnetic field produced by the capacitor current. With the field of magnetic flux thus constrained, the equivalent inductance, is reduced. See Van Duzer, et al., "Principles of Superconductive Devices and Circuits", 1981, pp. 109–115.

In a specific example of an embodiment of the invention, the metal layer lies over the capacitor by a distance of 700 nm (nanometer), measured between the bottom surface of A54 and the upper plate A52 of the capacitor, and that the layer A54 is approximately a rectangle of 50 nm by 50 nm in area, 600 nm thick, positioned over the capacitor. The capacitor is about 25 nm by 25 nm in area and the dielectric about 100 nm in thickness. The Josephson junctions are about 2.0 nm by 2.0 nm in surface area.

Figure 5:
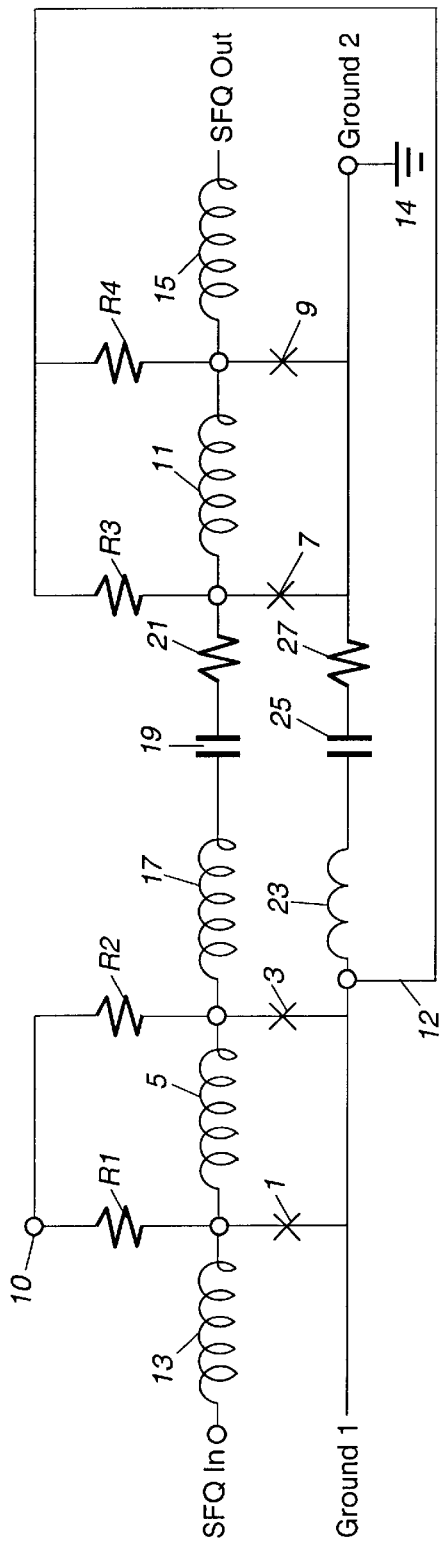
FIG. 5 is a schematic diagram of a preferred embodiment of a single flux quantum pulse transmission line constructed in accordance with the invention.

The capacitive coupling described in connection with the preceding embodiment is incorporated in a two-stage SFQ pulse transmission line, an embodiment of which is illustrated in the schematic of FIG. 5 to which reference is made. Instead of a single Josephson junction in each stage, the transmission line includes a Josephson loop formed by a pair of Josephson junctions. Thus, in the first stage, Josephson junctions 1 and 3 are connected in a Josephson loop. One terminal or end of each such junction is connected electrically in common (at a circuit common, "ground 1") and the remaining terminals of the two junctions are also connected in common through an inductance 5. The latter inductance, however, represents the equivalent self inductance or parasitic inductance inherent in the electrical leads or wiring joining the terminals of the two junctions. That inductance is visually identifiable by the wiring. As viewed externally, the two Josephson junctions appear connected directly in parallel by the wiring. The respective Josephson junctions are connected to the bias current supply at 10 via respective resistors R1 and R2.

A second pair of Josephson junctions 7 and 9 define a second Josephson loop, identical to the preceding Josephson loop, with inductance 11 being connected between one terminal of each Josephson junction and with the second terminal of those junctions connected electrically in common at another separate circuit common (ground 2). The respective Josephson junctions in this stage are connected to the bias current supply obtained over lead 12 from ground 1 of the first stage via respective resistors R3 and R4. Each Josephson loop is an active device in the foregoing electronic device, namely a two-stage single flux quantum pulse transmission line (JTL), as later herein more fully described.

Active superconductor devices are often referred to as a "SQUID", an acronym for superconducting quantum interference device. Being an active superconductor device, the Josephson loop is also sometimes referred to herein as a SQUID. As those skilled in the art will realize from an understanding of the present invention, the invention is not limited to a single Josephson loop, but may be applied to other SQUIDs as may contain more or less than the two Josephson junctions presented in the foregoing Josephson loops.

The signal input to the SQUID on the left (SFQ in) is through an inductance 13 to the upper terminal of Josephson junction 1, the inductance representing the self inductance of the lead or wire from the signal input to the terminal within the integrated circuit. The signal output (SFQ out) from the SQUID on the right is taken from the upper terminal of Josephson junction 9 through an inductance 15, the latter of which represents the self-inductance of the electrical lead or wire connecting the junction terminal to the output terminal.

A first series resistor-inductor-capacitor ("RLC") circuit connects between the output of the SQUID on the left, taken at the upper terminal of Josephson junction 3, to the input of the SQUID on the right, taken at the upper terminal of Josephson junction 7. The first RLC series circuit contains inductance 17, capacitance 19 and resistance 21. A second RLC series circuit connects between the electrical circuit common (ground) of the SQUID on the left to the electrical circuit common (ground) of the SQUID on the right, and contains inductance 23, capacitance 25 and resistance 27. In each such RLC circuit, the inductance is based in part on the self-inductance of the wiring connected to the dielectric or capacitance, as earlier described. That is, inductance 17 corresponds to the two inductances LS1 and LS2 of FIGS. 2 and 4 in series, the self-inductance of the wiring as modified by the effect of the sky plane A54; and inductance 23 corresponds to the two inductances LS3 and LS4 as modified by the effect of the sky plane A54. The capacitors 17 and 25 provide DC isolation in the signal circuit, and between the respective circuit common or grounds of the two SQUIDs. Each RLC circuit forms an AC signal circuit and provides DC isolation between the two SQUIDs in that signal circuit.

The DC current supply to supply the bias current to the Josephson junctions connects to an input at 10 and connects to the upper terminal of each Josephson junction 1 and 3, via electrical leads which contain inductance produced by self-inductance of the bias supply leads. The bias current path extends from the circuit common (circuit ground) of the first SQUID to the upper terminals of Josephson junctions 7 and 9 in the chain of SQUIDs, via lead 12, the same location in the second SQUID that serves as the signal input of the SQUID. The return lead to the bias current supply, the bias supply ground, is taken at the lower terminal of the Josephson junctions 7 and 9 and is represented by the power supply ground 14.

As those skilled in the art will recognize, the foregoing routing of the bias current to the pair of SQUIDs is new in the field. Instead of a parallel connection, the SQUIDs are connected in series in the DC bias current circuit. In operation with the circuit connected to a DC bias current source, not illustrated, DC bias current flows from the positive terminal of the current supply, divides evenly through Josephson junctions 1 and 3, recombines and flows through lead 12, divides evenly through Josephson junctions 7 and 9, recombines and returns to the ground terminal of the current supply via ground 14. Each SQUID in the foregoing current is biased with a current I. That is the same bias current as is required in a two-SQUID transmission line circuit of the prior design. However, in the latter "prior art" design, in order to supply current I to each SQUID, the bias current supply must supply a current of twice that level, 2I.

The SFQ pulse source applied at "SFQ IN" is necessarily not connected to the same ground as the bias supply, as such a connection would short-circuit any SFQ pulse. Instead the SFQ pulse source is isolated from that ground, and the pulse source ground is connected to the bottom metal layer or circuit common as variously termed (ground 1) of the first SQUID.

The circuit constitutes a two stage single flux quantum pulse transmission line. Single flux quantum pulses are generated by a so-called DC-to-SFQ converter, such as appears in the prior art. With the transmission line refrigerated and appropriately biased with DC current, each single flux quantum pulse applied at the input SFQ in from a source of those pulses, such as the foregoing source, produces a current into Josephson junction 1 that combines with the bias current through that junction to raise the total current above the critical current of the device. When that occurs, Josephson junction 1 undergoes the 360 degree phase shift. In so doing, a voltage pulse momentarily appears across the Josephson junction, and persists for about two picoseconds. The energy contained in that pulse is the same single flux quantum pulse that was applied. That voltage pulse couples through (and is modified in shape by) inductance 5, and is applied across Josephson junction 3. The latter junction in turn undergoes a 360 degree phase shift and about two picoseconds later produces another single flux quantum pulse across the terminals of the junction, which is applied to the inductor 17 in the series RLC circuit.

The capacitors 19 and 23 are those which have been modified in accordance with the teachings earlier presented in the discussion of FIGS. 1–4 so that the inherent self inductance of the wiring is reduced by the skyplane element. Hence, the inductance 17 is very low in value than otherwise, the RLC circuit is highly capacitive in characteristic, and the inductance cannot squelch or consume the pulse by limiting the current. The foregoing considerations also hold true for the second RLC circuit of inductor 23, capacitor 25 and resistor 27. The SFQ pulse is applied through capacitor 19 to one terminal of Josephson junction 7 in the second SQUID. The level of the voltage of the pulse is relative to the circuit common of the first SQUID; and that is reflected by the second RLC circuit to the other terminal of junction 7.

An important factor is the current through junction 7 produced by the SFQ pulse. The current from one terminal of Josephson junction 3 flows through the small inductor 17, capacitor 19, resistor 21, Josephson junction 7 (in which the current combines with the bias current through the junction), resistor 27, capacitor 25 and the small inductance 23, and returns through the remaining terminal of junction 3. Resistors 21 and 27 are small resistors that are preferably included to preclude possible electronic "ringing" of the RLC circuits. If such ringing is not of concern, the resistors may be omitted. By the foregoing action the SFQ pulse effectively "jumps" across the isolation gap in the signal path, and across the isolated circuit commons.

With the current through Josephson junction 7 in the second SQUID being driven beyond the critical current, the junction undergoes a 360 degree phase shift reproducing the single flux quantum pulse across the junction. This voltage pulse is applied to inductance 11 leading to Josephson junction 9, and as in the case of the earlier Josephson loop of the first SQUID, results in junction 19 producing a pulse through inductance 15 between SFQ out and the circuit common of the second SQUID. Each transfer of the SFQ pulse along the junctions in the line takes about two picoseconds of time.

As those skilled in the art appreciate, the generation of the SFQ pulse moves forward along the transmission line. It is seen that the two SQUIDs draw only one-half the current from the bias supply in comparison to the prior art two stage SFQ pulse transmission lines.

The foregoing transmission line contained two stages. As one should also appreciate, additional stages may be added to the foregoing transmission line using the same approach described for the initial stages to produce more circuitry without requiring an increase the bias supply current.

From the foregoing, one may observe that an aspect of the invention may be included in an alternative embodiment in which DC isolation is provided only in the signal circuit, but not between the circuit common of each SQUID. The bias supply for such an embodiment would be of the prior type in which DC bias current is supplied in parallel to each SQUID, requiring the source to supply current equal to the number of SQUIDs multiplied by the bias current required of a SQUID. The foregoing series arrangement for supplying DC bias current could not be used. Thus, such an embodiment would not obtain an a principal advantage provided by the invention, and, although within the scope of the capacitor aspect to the invention, is less preferred.

Figure 6:
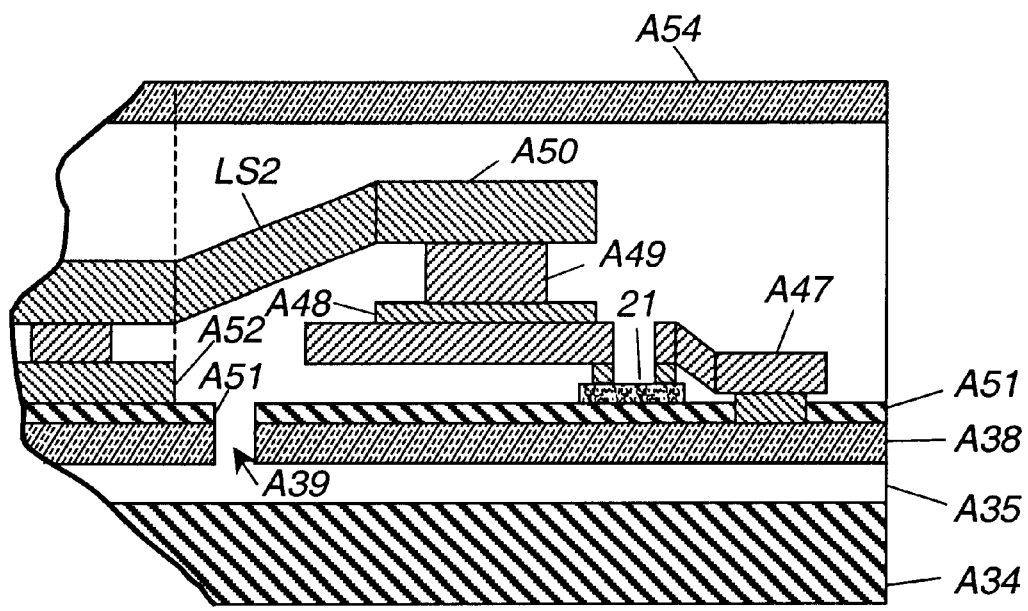
FIG. 6 is a partial section view of the superconductor integrated circuit of FIG. 2 as modified to incorporate a resistor used in the transmission line of FIG. 5.
Figure 7:
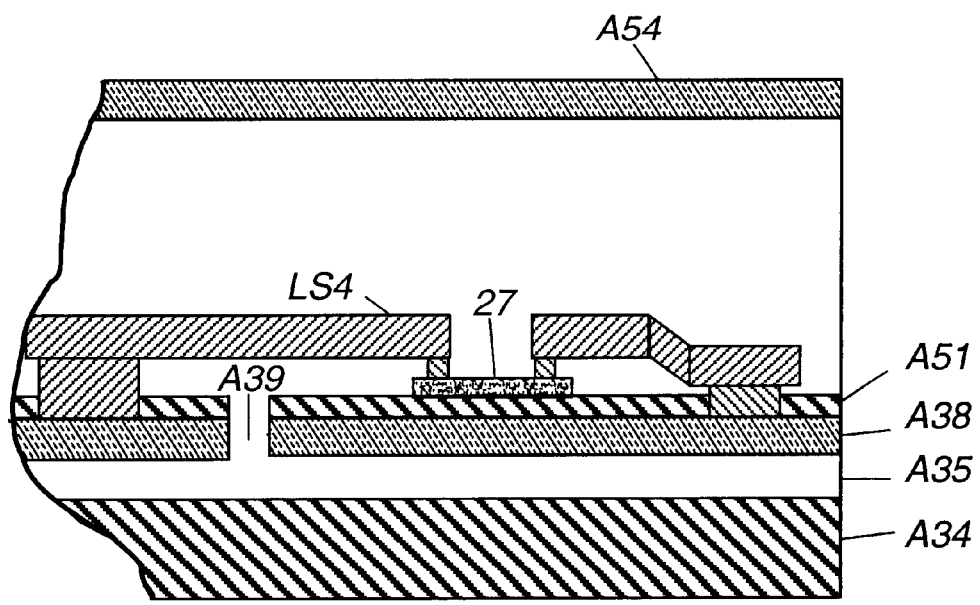
FIG. 7 is another partial section view of the superconductor integrated circuit illustrated in FIG. 3 as modified to incorporate the second resistor used in the transmission line of FIG. 5.

The physical structure of the foregoing transmission line should be self-evident to those skilled in the field of integrated circuits, particularly in view of the preceding description of FIGS. 1–4. For completeness, however, FIGS. 6 and 7 illustrate the inclusion of resistors 21 and 27, respectively. The partial section view of FIG. 6 is essentially identical with the corresponding side of FIG. 2, with an exception for resistor 21; and the partial section view of FIG. 7 is essentially identical to that view presented in the corresponding side of FIG. 3, with an exception for resistor 27. For ease of comparison and to avoid any necessity for repeating the description, the elements identified in the earlier figures are identified by the same denomination where those elements appear in these corresponding figures. In fabricating the integrated circuit for the transmission line of FIG. 5, resistance material 21 is deposited on top a portion of the residual dielectric material A51. Then vias are formed at the right and left sides. The electrical connection between A47 and the underside of Josephson junction 48 is formed segmented. One of those segments connects to the via on the right side of resistance 21 and the other of those segments connects to the via on the left, thereby placing the resistance 21 in series with a Josephson junction.

Referring to FIG. 7, resistor 27 is likewise deposited on top of a surplus portion of the dielectric material A51, the lead LS4 is formed segmented, and the resistance is placed in series circuit with lead LS4 by the vias that connect the respective ends of the resistance to the respective segments of LS4.

Figure 8:
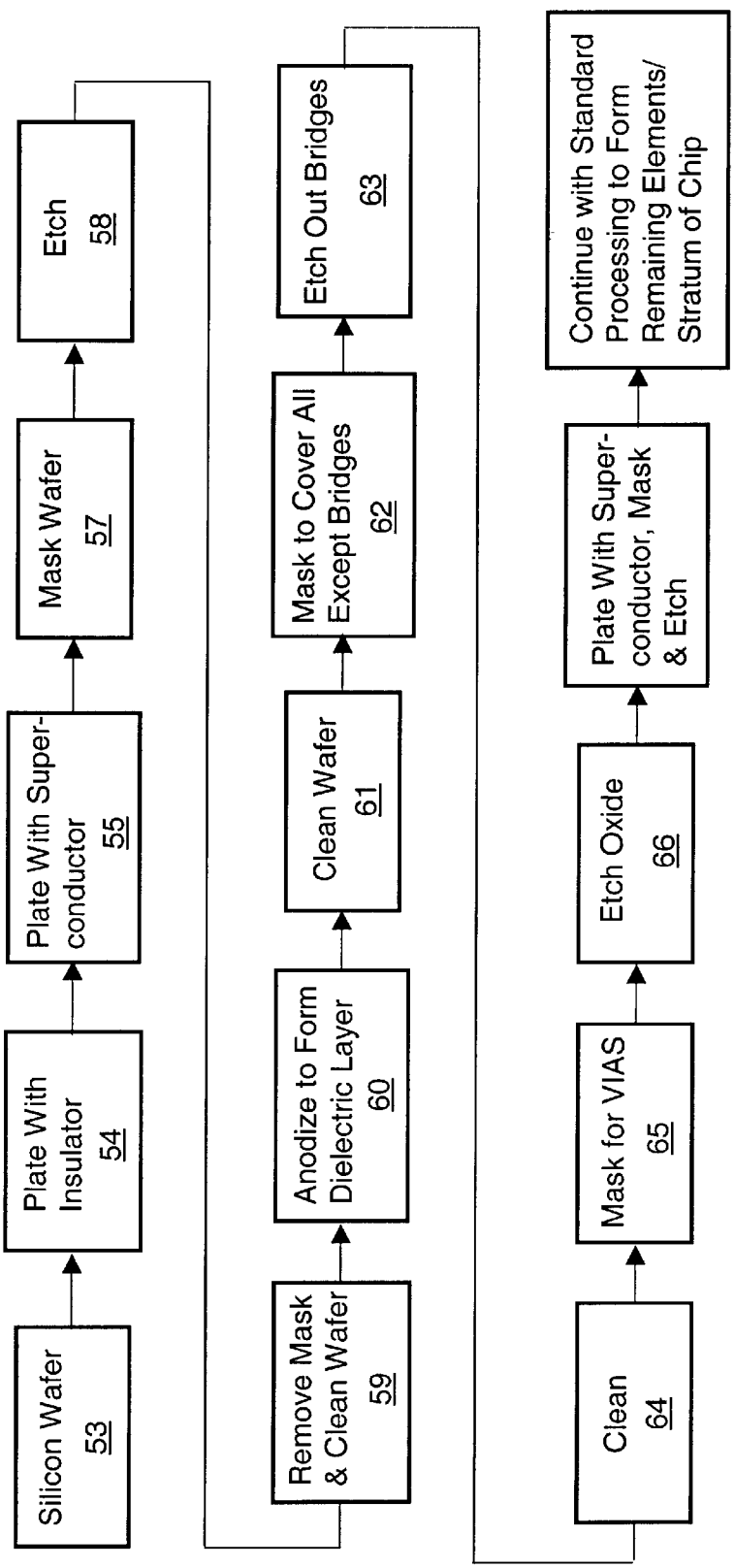
FIG. 8 illustrates the process by which the capacitors used in the embodiments of FIGS. 1–3 are fabricated.

The superconductor integrated circuit of FIGS. 1–4 as well as those schematically represented in FIG. 5 as may be self-evident is produced for the most part by the standard photolithography, mask, deposition, plating, and etch procedures known to those in the superconductor ICs and semiconductor art by which circuit patterns, insulating layers, and components are created in stratified layers on a silicon wafer to build up a complete structure or "chip". That known procedure is modified slightly to create the preferred form of the dielectric A51 for the capacitor. Referring to FIG. 8, the process begins with a standard silicon wafer 53, which is grown or deposited 54 first with an insulator layer A35, such as silicon dioxide, and then 55 with the superconductor metal, such as niobium. The Nb layer is masked 57 in the negative image of the pattern desired of the first metal layer on the wafer consisting of A36, A37, A38 in FIG. 1.

Referring again to FIG. 2 the first metal layer in the final form of the ICs includes A36, A37, and A38 which are electrically isolated from one another by the interstices containing insulation, such as silicon dioxide. The mask contains open regions defining the space between metal portions A36, A37 and A38. For reasons which become apparent, the mask does not contain the full interstices between the last mentioned bottom metal layer portions, but also leaves unmasked, lines or "bridges" between bottom metal layer portions A36 and A37, and between A37 and A38, and, not visible in FIG. 2, between A36 and A38.

The niobium metal is then etched out of the unmasked regions 58, the mask is removed or dissolved and the patterned wafer cleaned 59. At this stage all of the bottom portion regions A36–A38 are electrically connected in common by small bridges of the niobium 63, such as illustrated pictorially as the rectangular region shown in the layout of FIG. 1 As shown, each of the metal portions A36–A38, represented by the wide dark lines, are connected by a metal line or bridge A56.

A mask 60 is applied to the wafer to define the anodization and non-anodization regions. The wafer is then placed in a electrolytic bath to anodize 61 the exposed region of the niobium and produce a stratum A51 of niobium oxide on the exposed niobium layer. The anodization process requires that the surface that is to be anodized be connected to one terminal of an electrical supply. Because the metal portion A37 is impossible to access individually, it is necessary to connect the electric supply terminal to some other location on the wafer. The metal bridges electrically interconnect all of the metal portions in the bottom layer. Thus the anodization power supply need only connect to any portion of the lowermost metal layer, and that power supply is connected to portion A37.

Once anodization is completed, the bridges are no longer used. The electrically conductive bridges must then be removed to electrically isolate the separate metal portions of the bottom metal layer from one another as required in the structure of FIGS. 1, 2 and 3. Upon completion of the anodization procedure, the mask 60 is removed and the wafer is cleaned 62. The wafer is again masked 63 to cover all metal in the lowermost layer, except the bridges. The bridges, including portions A56 (FIG. 1), are then etched away 64 and the wafer is again cleaned 65.

The layer is then masked again 66 to leave exposed openings for the through-hole vias through the niobium oxide, the vias that connect A41, A53 and A47 in FIG. 2 to the respective bottom metal layers, A36, A37 and A38, and then the exposed oxide is etched away 67 to bare the top surface of those metal layers.

The wafer is again deposited with niobium to cover the niobium oxide, and the niobium is then masked to leave covered the wiring portions A41, the wiring portion under A53, the upper electrode A52 of the capacitor and A47 illustrated in FIG. 2, and the exposed metal is etched away.

Thereafter the additional stratums of metal, vias, and insulating material, including the Josephson junctions and skyplane niobium layer A54 (FIG. 2), are built onto the circuit using conventional procedures of superconductor integrated circuit processing to complete the integrated circuit. In a specific example, the chip ultimately will have a ground layer that is about 200 nm thick, a niobium oxide layer of about 144 nm thick, a shunt resistor of molybdenum about 105 nm thick, a bias resistor layer of $NbN_x$ about 140 nm thick; the three layer of the Josephson junction 200/5/100 nm in thickness, a silicon oxide insulator layer about 200 nm thick, a wire layer of Nb of 300 nm thick, a second layer of insulator about 450 nm thick, another wire layer of about 600 nm thick, a layer of Nb for the sky plane of about 750 nm thick, and a gold pad of alloy Ti/Pd/Au in thickness 40/400/40 nm.

By eliminating the impediment of the high current power supply, the foregoing invention makes possible superconductor very large scale integrated circuits, which essentially opens the field to larger and more complex superconductor integrated circuits as could lead to more widespread application of superconductor technology.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. A superconductor integrated circuit capacitor for squid-to-squid coupling of single flux quantum pulses while maintaining DC isolation, comprising:

a substrate of electrical insulating material;

a first plate electrode, said first plate electrode comprising a superconductor metal;

a second plate electrode, said second plate electrode comprising a superconductor metal;

a layer of dielectric material;

an electrical lead of superconducting material extending from said second plate electrode;

said first plate electrode overlying said substrate; said layer of dielectric material overlying and being in contact with said first plate electrode and said second plate electrode overlying and being in contact with said layer of dielectric material to define a capacitance;

a superconductor metal layer, said superconductor metal layer overlying and being in spaced relation to and covering said first and second plate electrodes and said electrical lead; and wherein the dielectric material of said layer of dielectric material comprises an oxide of said superconductor metal of said first plate electrode.

2. The superconductor integrated circuit capacitor of claim 1, wherein said superconductor metal of each of said first and second plate electrodes and said superconductor metal layer comprises niobium, and wherein the dielectric material of said layer of dielectric material comprises niobium oxide.

3. The superconductor integrated circuit capacitor of claim 1, wherein said layer of dielectric material and said first plate electrode comprise a unitary integral one-piece structure.

4. A superconductor integrated circuit capacitor pair for squid-to-squid coupling of single flux quantum pulses while maintaining DC isolation between squids, comprising.

a substrate of electrical insulating material;

a first plate electrode, said first plate electrode comprising a superconductor metal;

a second plate electrode, said second plate electrode comprising a superconductor metal;

a layer of dielectric material;

an electrical lead of superconducting material extending from said second plate electrode;

said first plate electrode overlying said substrate; said layer of dielectric material overlying and being in contact with said first plate electrode and said second plate electrode overlying and being in contact with said dielectric material to define a first capacitance; and wherein the dielectric material said layer of dielectric material comprises an oxide of said superconductor metal of said first plate electrode;

a third plate electrode, said third plate electrode comprising a superconductor metal that is the same as said superconductor metal of said first plate electrode;

a fourth plate electrode, said fourth plate electrode comprising a superconductor metal that is the same as said superconductor metal of said second plate electrode;

an additional layer of said dielectric material;

a second electrical lead of superconducting material extending from said fourth plate electrode;

said third plate electrode overlying said substrate; said additional layer of said dielectric material overlying and being in contact with said third plate electrode and said fourth plate electrode overlying and being in contact with said additional layer of dielectric material to define a second capacitance; and a superconductor metal layer, said superconductor layer overlying and being in spaced relation to and covering said first, second, third and fourth plate electrodes and said electrical lead and said second electrical lead.

5. The superconductor integrated circuit capacitor pair as defined in claim 4, further comprising an AC current conducting loop, said current conducting loop including said first and second capacitance and said electrical leads in a series circuit and defining a self-inductance.

\* \* \* \* \*